United States Patent [19]
Koch et al.

[11] Patent Number: 5,220,578
[45] Date of Patent: Jun. 15, 1993

[54] LONG TERM MODE STABILIZATION FOR DISTRIBUTED BRAGG REFLECTOR LASER

[75] Inventors: Thomas L. Koch, Holmdel; Sheryl L. Woodward, Lincroft, both of N.J.

[73] Assignee: AT&T Bell Laboratories, Murray Hill, N.J.

[21] Appl. No.: 786,480

[22] Filed: Nov. 1, 1991

[51] Int. Cl.$^5$ .................................................. H01S 3/10
[52] U.S. Cl. ...................................... 372/96; 372/20; 372/31; 372/32; 372/50
[58] Field of Search .................... 372/32, 31, 20, 96, 372/50

[56] References Cited

U.S. PATENT DOCUMENTS 4,785,454  11/1988  Olsson et al. ........................ 372/26
5,119,393  6/1992  Oka et al. ............................ 372/50

OTHER PUBLICATIONS

N. A. Olsson et al., *J. of Lightwave Tech.*, vol. LT-2, No. 1, Feb. 1984, "Active Spectral Stabilization of Cleaved-Coupled-Cavity . . . ," pp. 49-51.

L. A. Coldren et al., *IEEE J. Quantum Elec.*, vol. QE-23, No. 6, Jun. 1987, "Continuously-Tunable Single-Frequency . . . ," pp. 903-908.

T. L. Koch et al., *Elec. Lett.*, vol. 24, No. 23, Nov. 10, 1988, "Continuously Tunable 1.5 mu m Multiple-Quantum-Well . . . ," pp. 1431-1433.

S. L. Woodward et al., *IEEE Photonics Tech. Lett.*, vol. 2, No. 12, Dec. 1990, "The Side-Mode-Suppression Ratio of a Tunable DBR Laser," pp. 854-856.

Primary Examiner—James W. Davie
Attorney, Agent, or Firm—Gregory C. Ranieri

[57] ABSTRACT

A light transmitter comprising a distributed Bragg reflector laser and mode stabilization feedback means is described for maintaining the laser in single longitudinal mode operation.

12 Claims, 8 Drawing Sheets

LONG TERM MODE STABILIZATION FOR DISTRIBUTED BRAGG REFLECTOR LASER

TECHNICAL FIELD

This invention relates to semiconductor lasers and, more particularly, to arrangements for stabilizing a semiconductor laser to maintain a single frequency or, alternatively, a single Fabry-Perot mode output.

BACKGROUND OF THE INVENTION

Wavelength division multiplexing permits transmission of a large number of different optical channels in a lightwave communication system. In order to accomplish this, it is generally necessary to have a plurality of light sources wherein each light source is tuned or set to a particular operating wavelength different from the operating wavelength for the other light sources. That is, no two light sources in the wavelength division multiplexed system share the same operating wavelength. Tunable single frequency (wavelength) lasers such as distributed feedback and distributed Bragg reflector lasers are sufficiently versatile to meet the requirements necessary for being light sources in a wavelength division multiplexed lightwave communication system. For example, see IEEE J. of Quantum Elec., Vol. QE-23, No. 6, pp. 903-8 (1987).

Tunable distributed Bragg reflector (DBR) lasers have electrically isolated contacts so that one current can be applied to the Bragg section while a separate current can be independently applied to the gain section. For example, see Elect. Lett., Vol. 24, No. 23, pp. 1431-3 (1988) showing a three-section continuously tunable DBR laser having Bragg, phase, and gain sections. By applying a predetermined current to the Bragg section, it is possible to tune the Bragg grating and therefore the Bragg wavelength, $\lambda_B$, to a wavelength which corresponds to a wavelength of one of the longitudinal or Fabry-Perot modes of the laser. By utilizing this technique with a plurality of tunable DBR lasers, one could obtain a corresponding plurality of individually mutual exclusive wavelengths, each for a separate channel, so that wavelength division multiplexing can be achieved.

As the tunable DBR lasers in the wavelength division multiplexing application described above are run for a long period of time, the devices degrade in performance because of aging and material defects. As a result, the Bragg reflection characteristic drifts in wavelength. In other words, the effective period for the Bragg grating drifts or changes. The wavelength drift of the grating can be large enough to cause a "mode hop" to occur wherein the originally lasing longitudinal mode is discriminated against by the Bragg grating in favor of another mode which was formerly a side longitudinal mode of the original lasing mode. In the wavelength division multiplexing application, this would cause a channel experiencing a mode hop to appear at a wavelength, and therefore a different longitudinal mode, from that originally assigned.

SUMMARY OF THE INVENTION

Wavelength drift resulting from aging and defects and mode hopping are substantially eliminated for a distributed Bragg reflector laser by monitoring back facet light output from the Bragg section of the laser and, in response to the monitored light output, controllably adjusting the effective period of the Bragg grating in the Bragg section of the laser so that single mode operation at a substantially constant wavelength. Controllable adjustment of the Bragg period is achieved in an exemplary embodiment by measuring a characteristic of the monitored light output with respect to the Bragg section current and adjusting the Bragg section current in response to the measured characteristic to maintain single longitudinal mode operation of the laser at a substantially constant wavelength during long-term operation.

BRIEF DESCRIPTION OF THE DRAWING

A more complete understanding of the invention may be obtained by reading the following description of a specific illustrative embodiment of the invention in conjunction with the appended drawing in which.

DETAILED DESCRIPTION

In accordance with the principles of the present invention, a feedback control circuit which detects light output from a tunable distributed Bragg reflector laser and controllably adjusts the effective period of the diffraction grating in the Bragg section of the laser insures single wavelength operation of the laser in a predetermined longitudinal mode. When the feedback control circuit is operational, the laser output is substantially single wavelength and mode hopping of the laser is substantially eliminated. The exemplary feedback control circuit shown in FIG. 1 uses no external optics. An error signal is derived from a photodetector integrated with the laser. The photodetector measures the light transmitted through the Bragg section of the laser, that is, the back facet light output of the laser. The error signal is used to control the current supplied to the Bragg section of the laser. By varying the current to the Bragg section, the period of the Bragg grating is adjusted causing the Bragg wavelength to coincide with a predetermined longitudinal or Fabry-Perot mode of the laser. As a result of this tuning, the laser output exhibits a maximum sidemode suppression ratio.

Figure 1:
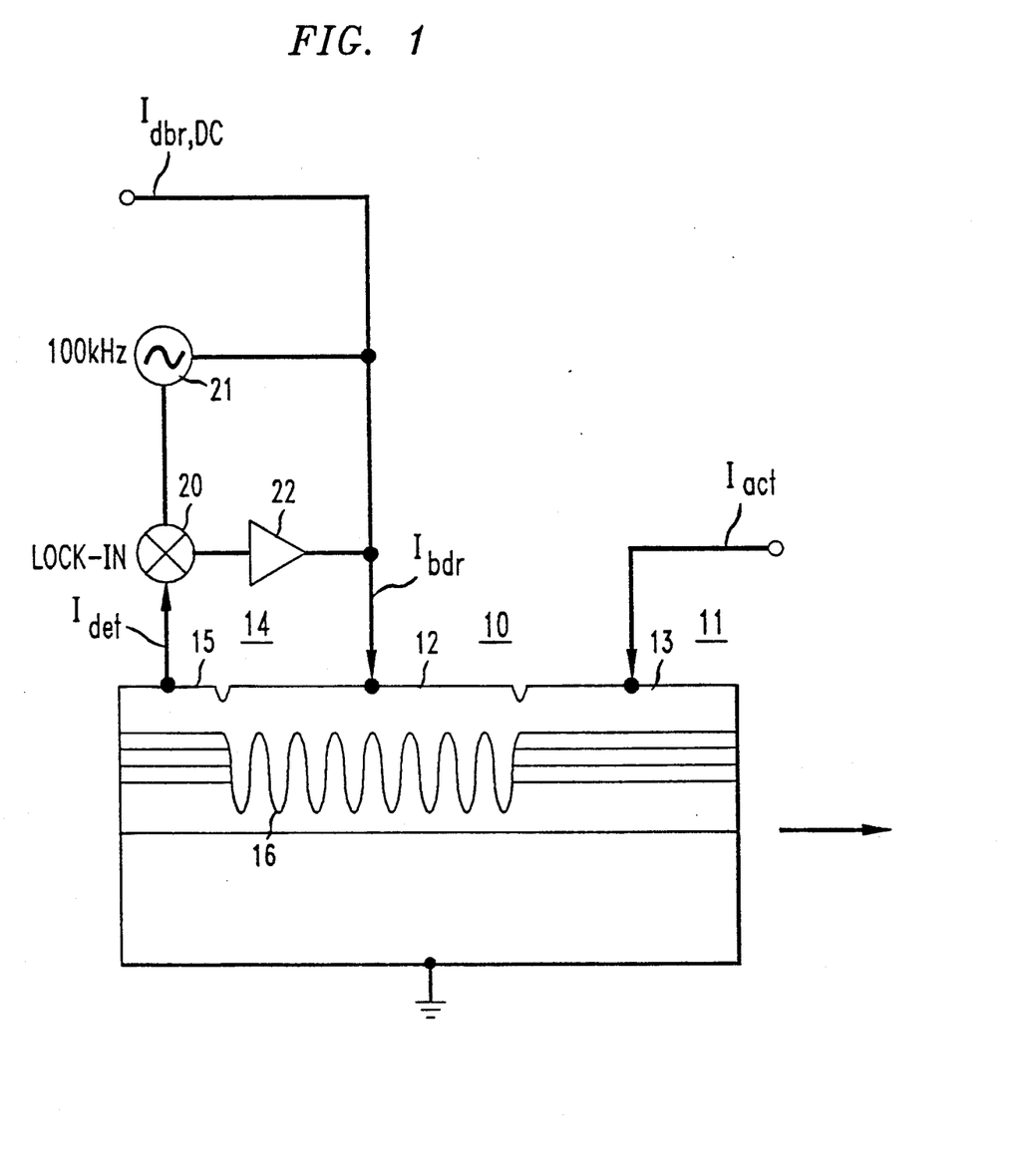
FIG. 1 shows a schematic diagram of a distributed Bragg reflector laser in combination with a feedback control circuit for maintaining single wavelength operation in a desired longitudinal mode.

FIG. 1 shows a simplified schematic diagram of a tunable, multi-section distributed Bragg reflector laser together with an exemplary feedback control circuit. The distributed Bragg reflector laser includes Bragg section 10, gain section 11, and integrated photodiode section 14. Bragg section 10 includes diffraction grating (Bragg grating) 16 and metallic contact 12. Gain section 13 employs a multiple quantum well stack in the active region which is controlled via contact 13. Detected photocurrent is output by photodiode 14 via contact 15. Details concerning the realization and fabrication of this type of tunable distributed Bragg reflector laser are well known in the art and have been described in *Applied Physics Letters*, Vol. 58, pp. 1239-40 (1991).

In the feedback control circuit shown in FIG. 1, the current to the Bragg section ($I_{dbr}$) is biased so that the feedback operation cannot inadvertently reverse bias the Bragg section of the laser. A high speed dither signal is applied by oscillator 21 to lock-in amplifier circuit element 20. The high speed dither signal is combined with the detected photocurrent ($I_{det}$) from photodiode 14 to permit detection by the lock-in amplifier. Following detection, this signal is amplified and fed back to the Bragg section as an element of the applied Bragg current. The dc bias of the Bragg section is supplied as current $I_{dbr,DC}$.

The operation of the circuit is as follows. A small ac current, approximately 0.2 mA (peak-to-peak) at a frequency of approximately 100 kHz from oscillator 21, is applied to the Bragg section of the laser. The output power from Bragg section 10 is detected by the integrated photodiode 14. The signal from the photodiode is applied directly to lock-in amplifier element 20. The first derivative of the light output with respect to the current applied to the Bragg section ($I_{dbr}$) is obtained by detecting the 100 kHz component of the output power using lock-in amplifier element 20. As such, the means for measuring at least one characteristic of the light output from the Bragg section of the laser comprises photodiode 14 and lock-in amplifier element 20. Following amplification of the detected signal by amplifier 22, the amplifier output is fed back to the Bragg section of the laser thereby closing the feedback loop. As such, the feedback means comprises lock-in amplifier 20, amplifier 22, and oscillator 21. Operation and construction on the individual components of the feedback control circuit are known and understood by those skilled in the art and are not discussed below in further detail.

Figure 2:
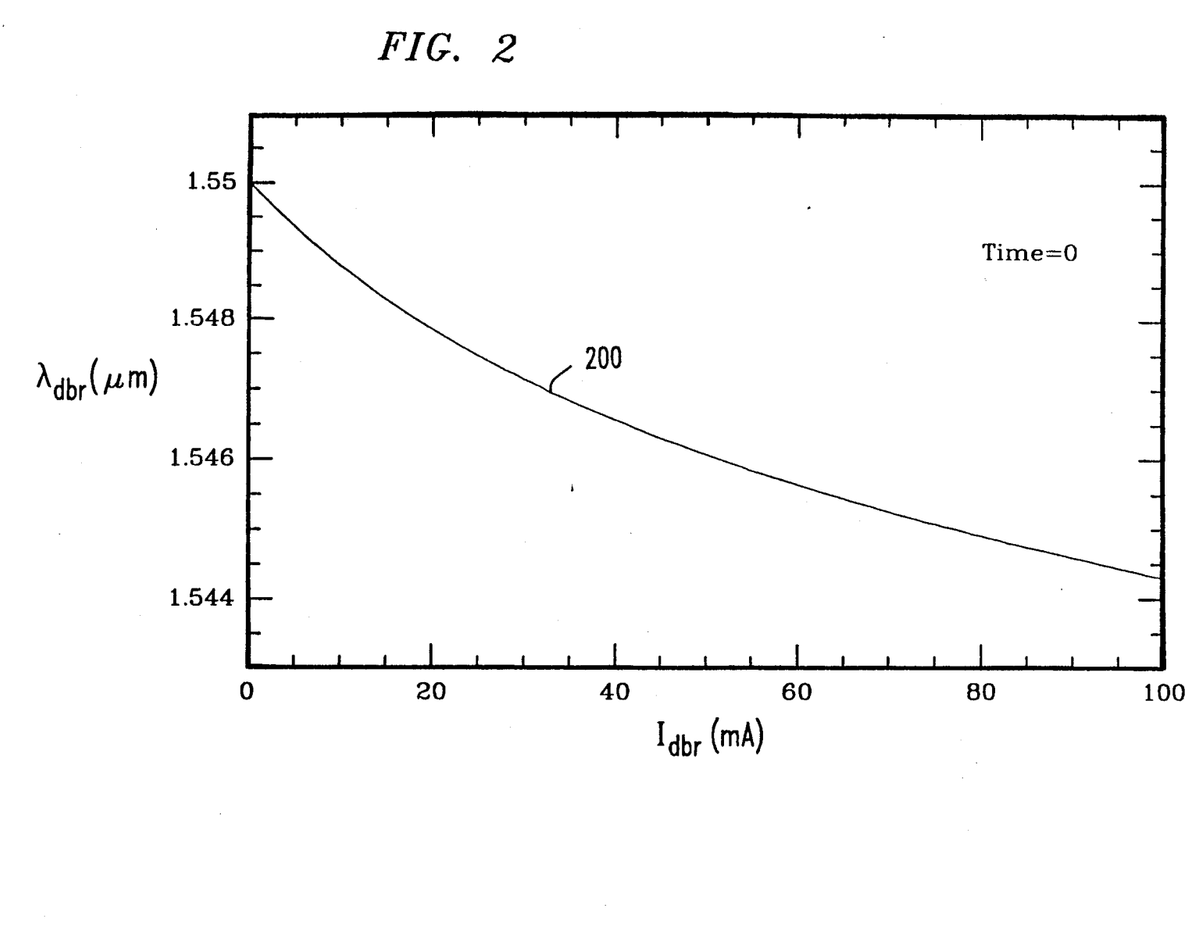
FIG. 2 shows an illustrative plot of Bragg wavelength versus applied current for the Bragg section.

FIG. 2 shows an exemplary plot of the variation of the Bragg wavelength as a function of the Bragg current. The Bragg wavelength is a center wavelength for the reflectivity characteristic of Bragg grating 16. One such reflectivity characteristic is shown in FIG. 3 as curve 300.

Figure 3:
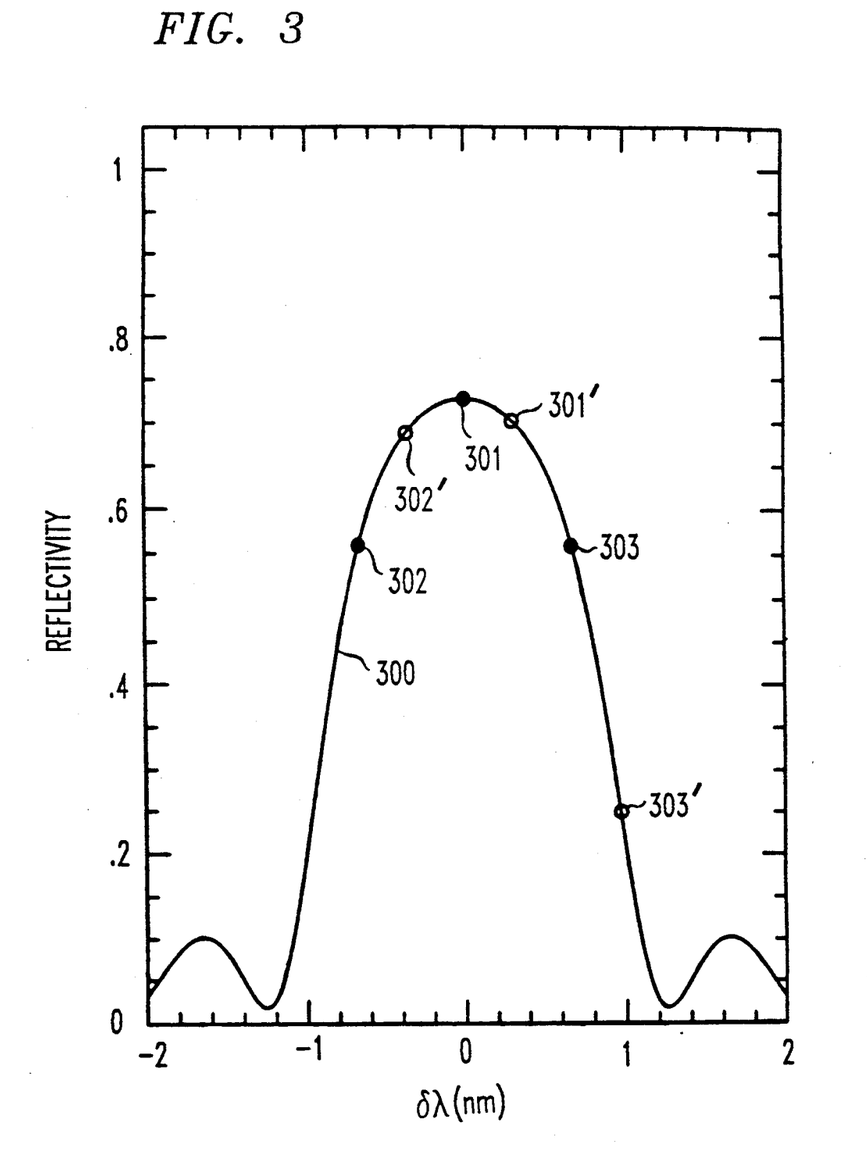
FIG. 3 shows a graph of reflectivity for the Bragg grating versus wavelength difference between the Bragg wavelength and a longitudinal mode of the laser.
Figure 4:
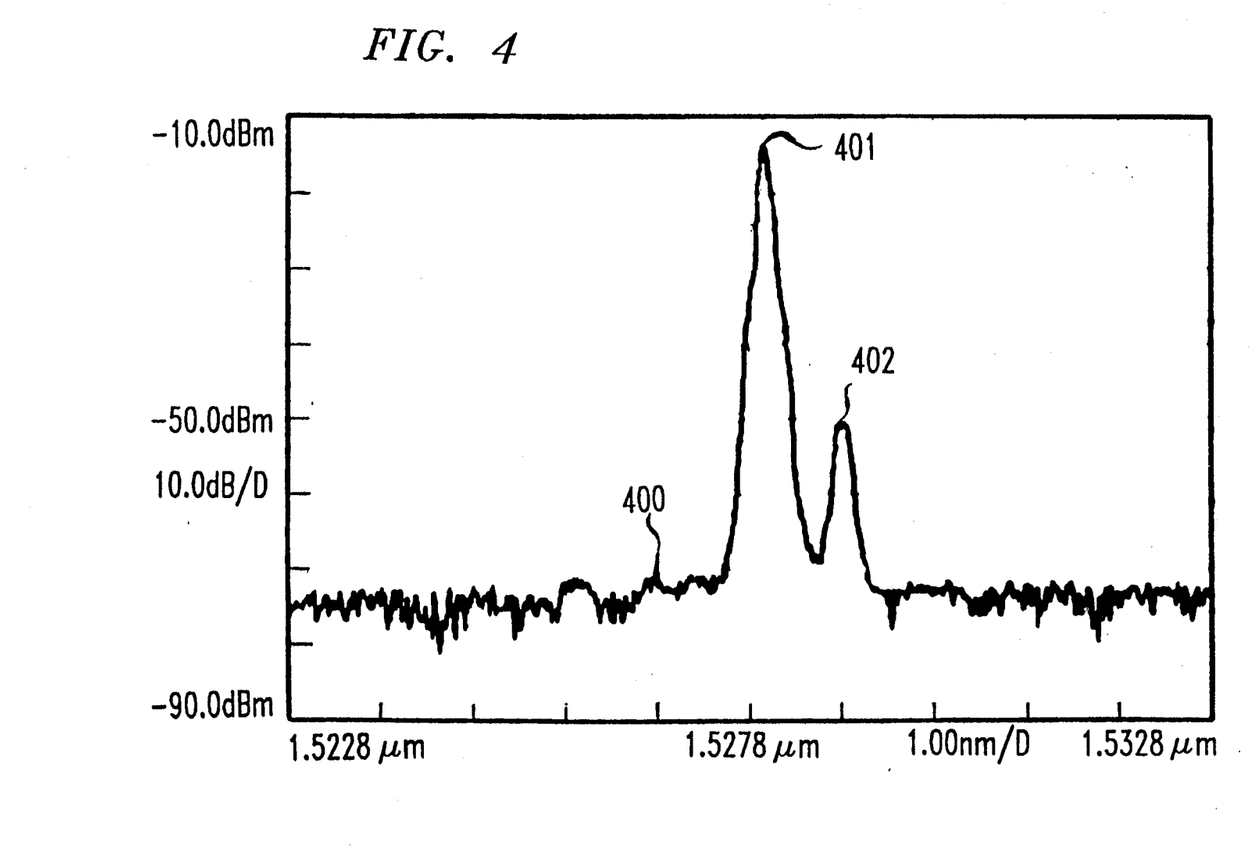
FIGS. 4 and 5 show output spectra for an exemplary distributed Bragg reflector laser both with and without control of the Bragg section current.
Figure 5:
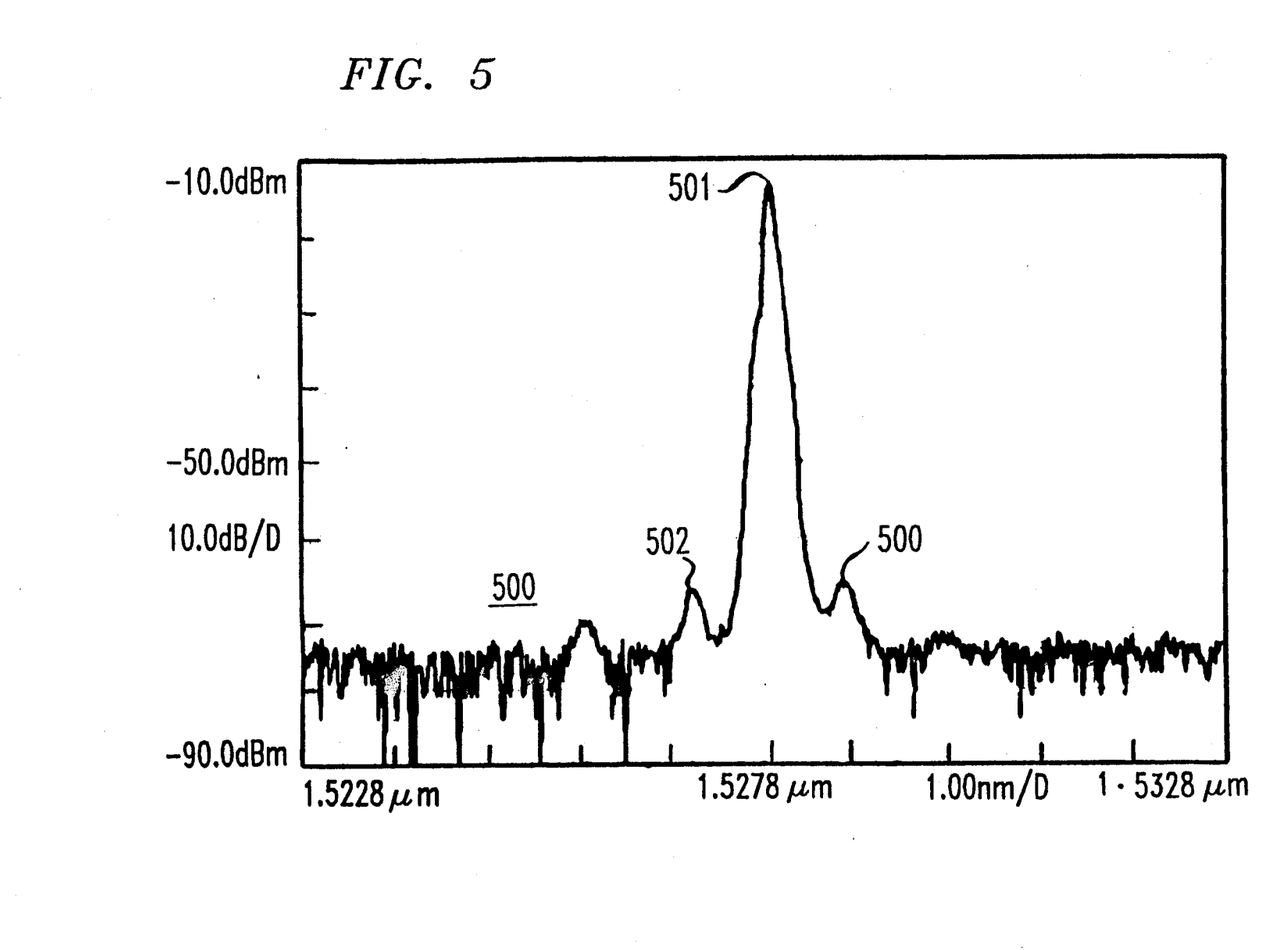

As shown in FIGS. 3 and 5, the sidemode suppression ratio is maximum when the desired longitudinal mode of the laser is at or near the center of the Bragg reflectivity characteristic or Bragg band. It can be seen in FIG. 3 that this occurs when the main mode is at the Bragg wavelength corresponding to point 301 on the reflectivity characteristic and when the side longitudinal modes are at wavelengths corresponding to points 302 and 303 on the reflectivity characteristic. As shown in FIG. 5, the main longitudinal mode 501 far exceeds side longitudinal modes 502 and 503, both of which appear with substantially equal power levels. In contrast, the sidemode suppression ratio for the laser is degraded when the main longitudinal mode is not centered at the Bragg wavelength. This condition is shown by points 301', 302', and 303' on the reflectivity characteristic curve 300. The degraded sidemode suppression ratio is further shown in FIG. 4 wherein output spectra 400 shows a main longitudinal mode 401 and an extremely high side longitudinal mode 402. This imbalance of mode powers seriously degrades the sidemode suppression ratio of the laser.

It should be noted that the reflectivity of grating 16 in the Bragg section is a maximum at the Bragg wavelength so that, when operating at the Bragg wavelength, a smaller fraction of light is transmitted through the Bragg section toward photodiode 14. The feedback control circuit shown in FIG. 1 adjusts the Bragg section current in a controllable manner so that the amount of light transmitted through the Bragg section is minimized which, in turn, causes the desired operating wavelength of the laser to be simultaneously adjusted close to the center of the Bragg band at or near the Bragg wavelength. Of course, this implies that the sidemode suppression ratio of the laser approaches its maximum. Once set to the desired operating wavelength, the laser is maintained at that wavelength by automatically changing the Bragg section current via the feedback control circuit in order to compensate for the effects of aging. In an example from experimental practice, the dc bias of the laser was set to approximately 10 mA resulting in a sidemode suppression ratio of 36.6 dB for a desired operating wavelength at 1.528 µm without any feedback control. After the feedback control circuit was closed, the Bragg section current changed to 14.7 mA. This corresponded to a point where the light detected by photodiode 14 was minimized. The sidemode suppression ratio at this Bragg section current rose to 53.2 dB. The operating wavelength of the laser was shifted by 0.6 Å. This type of operation with the feedback control circuit on and off is exemplified in FIG. 3 by the viewing the modes being pulled to positions 301, 302, and 303 in the Bragg band where the main longitudinal mode of the laser is a point 301.

Figure 7:
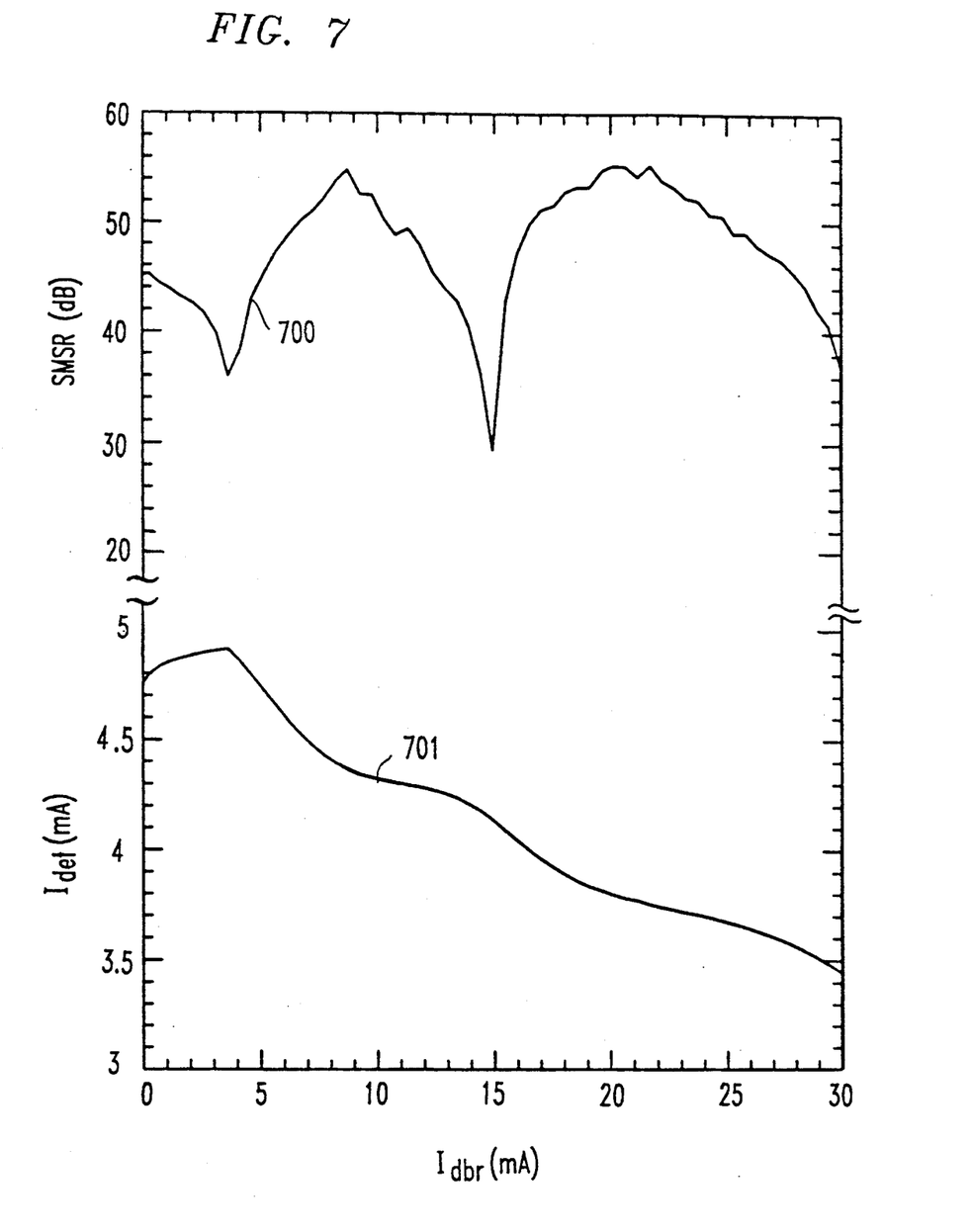

The strength of the grating relative to the strength of the facet reflector on the active or gain section of the laser is believed to affect the performance of the mode stabilization apparatus. In particular, when the Bragg grating strength is sufficiently close to the strength of the facet reflector of the gain section, the lock-in amplifier will be unable to detect any points where the first derivative of $I_{det}$ is zero. One particular example fitting these conditions occurred in experimental practice and is shown in FIG. 7. For the example shown in FIG. 7, the grating strength of Bragg grating 16 was $\kappa L_{dbr} \sim 1$. It can be seen from curve 701 that the current from photodiode 14 does not have a point at which its first derivative is equal to zero. As such, the feedback control circuit is unable to find a suitable wavelength on which to lock.

Figure 6:
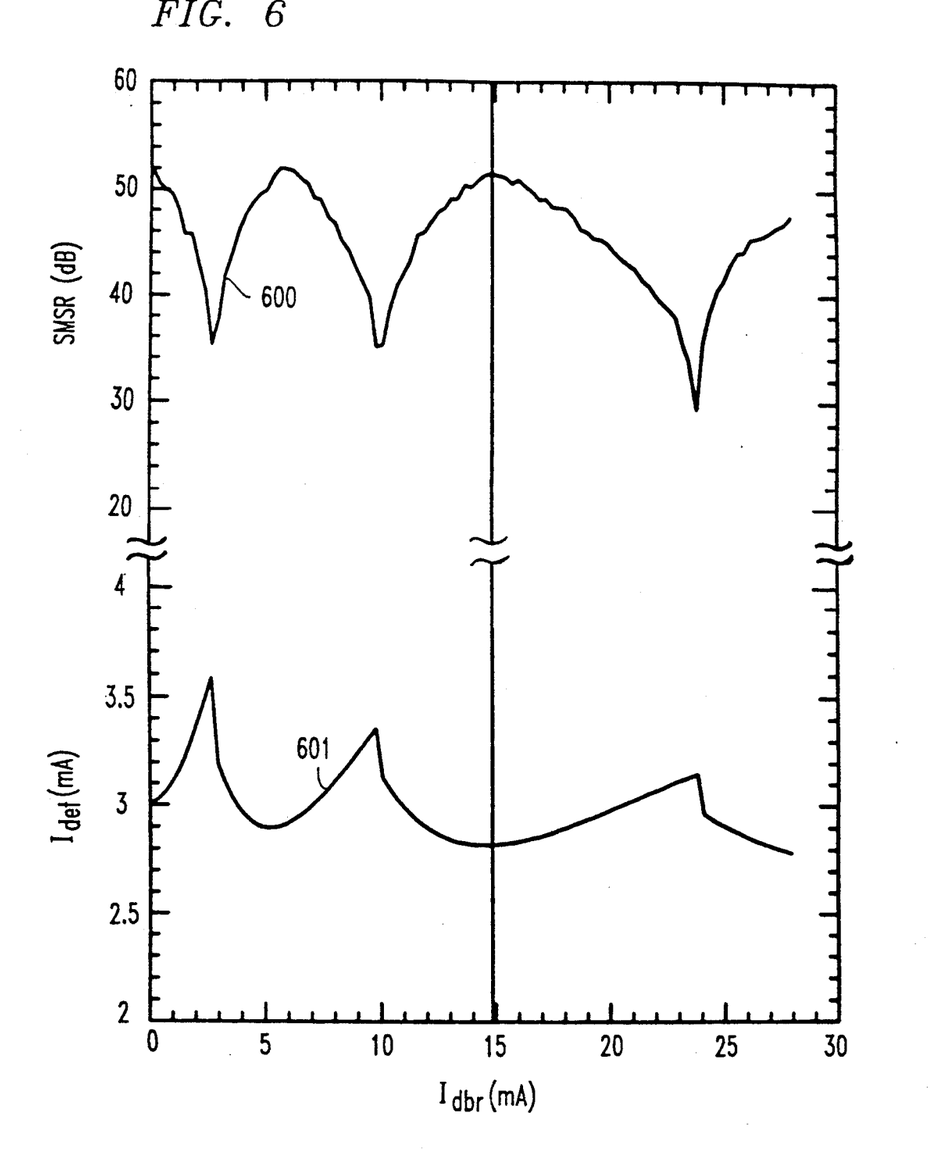
FIGS. 6-8 show detected photocurrent and sidemode suppression ratio versus Bragg section current for Bragg gratings of varying strength in a tunable distributed Bragg reflector laser.

The example depicted in FIG. 6 is for a moderately strong grating where $\kappa L_{dbr}$ is approximately greater than 1 (for the example in FIG. 6, the grating strength is approximately 1.3) and where the facet reflectivity is approximately 32%. For this type of moderately strong Bragg grating, the mirror losses are dominated by the front facet and tuning of the grating has negligible effect on the total mirror loss. Output power of the laser does not depend strongly on the tuning operation. By adjusting the current to the Bragg section of a laser such that the light transmitted through the Bragg section is minimized, the desired operating wavelength of the laser is simultaneously adjusted to be close to the center of the Bragg band, that is, at or near the Bragg wavelength. This implies that the sidemode suppression ratio of the laser is close to a maximum. As shown in FIG. 6, minima, that is, points at which the first derivative are zero, for curve 601 corresponds to maxima for the sidemode suppression ratio.

Figure 8:
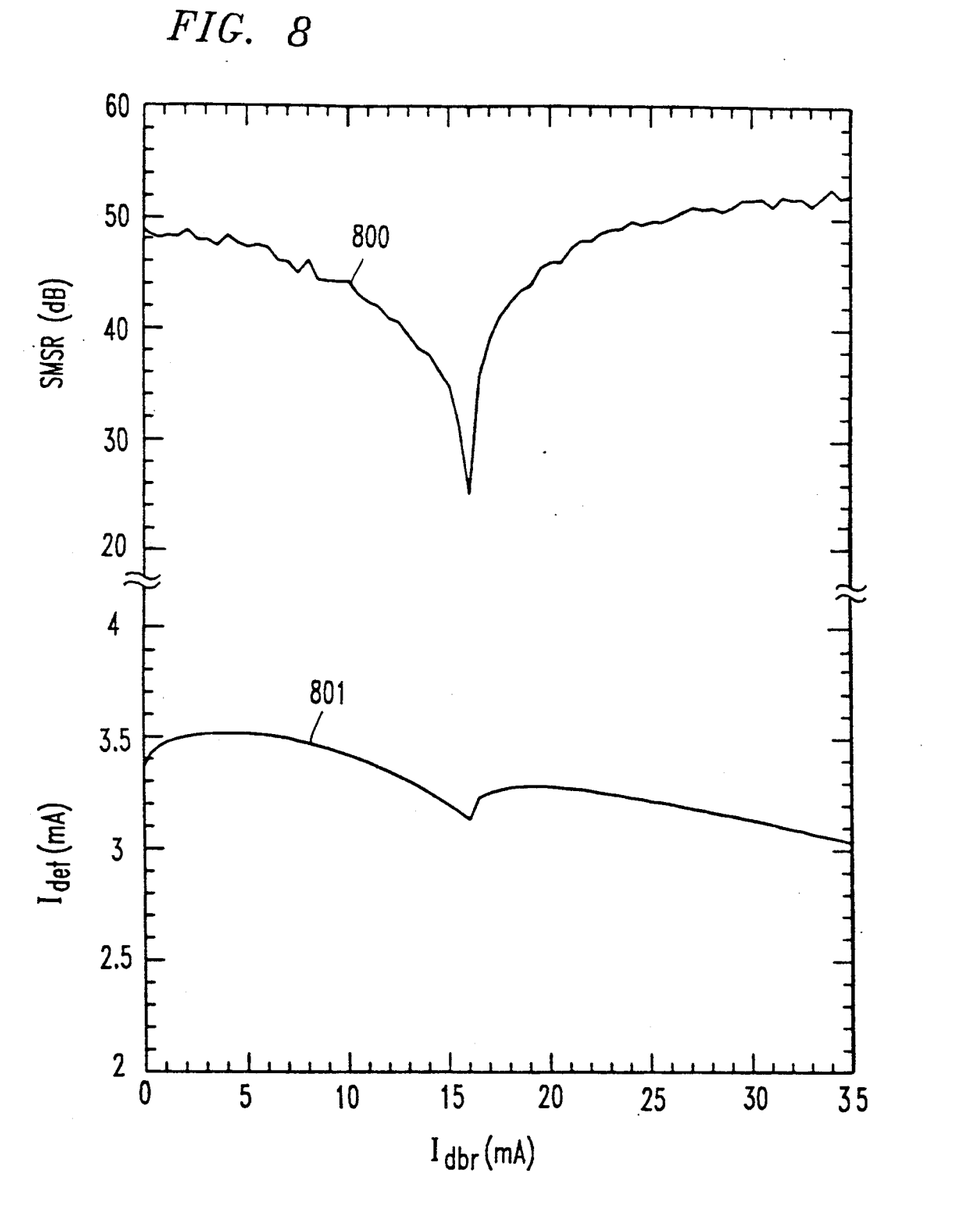

In lasers having a very weak grating such that the reflectivity of the Bragg section is comparable to the facet reflectivity, a change in the Bragg section current strongly effects total mirror loss and, hence, the threshold current to the laser. In this case, total light output varies significantly with the Bragg section current and reaches a maximum when the Bragg reflectivity is at or near its maximum. Although the fraction of light transmitted through the Bragg section to photodiode 14 is minimized at this point, the change in detected light is dominated by the change in total output power. Hence, the light transmitted through the Bragg section is at a maximum when the desired operating wavelength of the laser is near the center of the Bragg band. In lasers with a sufficiently weak Bragg grating, it is possible to insure a high sidemode suppression ratio by adjusting the Bragg current to a point where the light transmitted through the Bragg section is a maximum rather than a minimum. This point corresponds to a zero for the first derivative of the current output by photodiode 14. The case of a weak Bragg grating is depicted in FIG. 8 wherein the Bragg grating strength is approximately 0.4 and the facet reflectivity is approximately 32%.

It will be understood by those skilled in the art that, while the description above relates solely to tuning the Bragg section via an applied current, it is contemplated that the same circuitry may be used to apply voltages to tune the Bragg section.

What is claimed is:

1. A lightwave transmitter comprising:
   a multi-section distributed Bragg reflector laser comprising a gain section and a Bragg section having an effective period,
   means for measuring at least one characteristic of light output from said Bragg section with respect to current applied through said Bragg section, and
   feedback means responsive to said at least one characteristic for controllably adjusting said effective period of said Bragg section to maintain laser output at a desired spectral value.

2. The lightwave transmitter as defined in claim 1 in which said at least one characteristic comprises the first derivative of the light output intensity with respect to said current through said Bragg section.

3. The lightwave transmitter as defined in claim 2 in which said feedback means maintains said first derivative at a value of approximately zero.

4. The lightwave transmitter as defined in claim 3 in which said feedback means maintains the value of approximately zero at a local minimum in the light output power versus Bragg section current characteristic curve.

5. The lightwave transmitter as defined in claim 4 wherein said Bragg section includes a diffraction grating having said effective period, said lightwave transmitter further comprising means for adjusting the Bragg section current to said Bragg section to control said effective period of said diffraction grating.

6. The lightwave transmitter as defined in claim 1 wherein said at least one characteristic comprises the light output intensity.

7. The lightwave transmitter as defined in claim 6 wherein said feedback means maintains said characteristic at a local maximum in the light output power versus Bragg section current characteristic curve.

8. The lightwave transmitter as defined in claim 4 wherein said Bragg section includes a diffraction grating having said effective period, said lightwave transmitter further comprising means for adjusting the Bragg section current to said Bragg section to control said effective period of said diffraction grating.

9. The lightwave transmitter as defined in claim 3 in which said feedback means maintains the value of approximately zero at a local minimum in the light output power versus Bragg section current characteristic curve.

10. The lightwave transmitter as defined in claim 9 wherein said Bragg section includes a diffraction grating having an effective period, said lightwave transmitter further comprising means for adjusting the Bragg section current to said Bragg section to control said effective period of said diffraction grating.

11. The lightwave transmitter as defined in claim 6 wherein said feedback means maintains said characteristic at a local maximum in the light output power versus Bragg section current characteristic curve.

12. The lightwave transmitter as defined in claim 11 wherein said Bragg section includes a diffraction grating having an effective period, said lightwave transmitter further comprising means for adjusting the Bragg section current to said Bragg section to control said effective period of said diffraction grating.

* * * * *